(12) United States Patent
Hashimoto

(10) Patent No.: US 7,132,844 B2
(45) Date of Patent: Nov. 7, 2006

(54) TESTING DEVICE AND TESTING METHOD FOR TESTING AN ELECTRONIC DEVICE

(75) Inventor: Yoshihiro Hashimoto, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 11/131,151

(22) Filed: May 17, 2005

(65) Prior Publication Data
US 2005/0209801 A1  Sep. 22, 2005

Related U.S. Application Data

(63) Continuation of application No. PCT/JP03/14796, filed on Nov. 20, 2003.

(30) Foreign Application Priority Data
Nov. 21, 2002 (JP) .............................. 2002-338336

(51) Int. Cl.
G01R 31/26 (2006.01)
(52) U.S. Cl. ..................................... 324/765
(58) Field of Classification Search .................... None
See application file for complete search history.

(56) References Cited

U.S. PATENT DOCUMENTS

| 4,800,334 A | * | 1/1989 | Berney ........................ 324/772 |
| 6,246,248 B1 | * | 6/2001 | Yamagishi .................. 324/763 |

FOREIGN PATENT DOCUMENTS

| JP | 57-44867 | 3/1982 |
| JP | 03-183967 | 8/1991 |
| JP | 5-45418 | 2/1993 |
| JP | 7-27836 | 1/1995 |
| JP | 07-243875 | 9/1995 |
| JP | 08-272459 | 10/1996 |
| JP | 09-275343 | 10/1997 |
| JP | 10-002930 | 1/1998 |
| JP | 10-73645 | 3/1998 |
| JP | 11-174114 | 7/1999 |
| JP | 2000-193709 | 7/2000 |
| JP | 2000-241454 | 9/2000 |
| JP | 2000-332583 | 11/2000 |
| JP | 2001-27660 | 1/2001 |
| JP | 2001-051010 | 2/2001 |
| JP | 2001-324552 | 11/2001 |

(Continued)

OTHER PUBLICATIONS

Patent Abstracts of Japan, Publication No. 2001-027660 dated Jan. 30, 2001, 1 page.

(Continued)

Primary Examiner—Jermele Hollington
Assistant Examiner—Trung Q. Nguyen
(74) Attorney, Agent, or Firm—Osha-Liang LLP

(57) ABSTRACT

A testing device that tests an electronic device includes a detection-voltage outputting unit operable to output a current detection voltage based on a power source current that the electronic device receives from a power source, a transmission line operable to transmit the current detection voltage, a detection amplifier operable to output an amplifier output voltage based on the current detection voltage received through the transmission line, a switching unit operable to select whether the current detection voltage is supplied to the detection amplifier, an integrator operable to output an integral value that is obtained by integrating values based on the amplifier output voltage, and a decision unit operable to decide whether the electronic device is good or bad based on the integral value.

16 Claims, 9 Drawing Sheets

FOREIGN PATENT DOCUMENTS

| | | |
|---|---|---|
| JP | 2002-181899 | 6/2002 |
| JP | 2002-196049 | 7/2002 |
| WO | WO01/13136 A1 | 2/2001 |

OTHER PUBLICATIONS

Patent Abstracts of Japan, Publication No. 2000-332583 dated Nov. 30, 2000, 1 page.

Patent Abstracts of Japan, Publication No. 07-027836 dated Jan. 31, 1995,1 page.

Patent Abstracts of Japan, Publication No. 2002-181899 dated Jun. 26, 2002, 1 page.

Patent Abstracts of Japan, Publication No. 05-045418 dated Feb. 23, 1993,1 page.

Patent Abstracts of Japan, Publication No. 2002-196049 dated Jul. 10, 2002, 1 page.

Patent Abstracts of Japan, Publication No. 10-073645 dated Mar. 17, 1998, 1 page.

Patent Abstracts of Japan, Publication No. 2001-324552 dated Nov. 22, 2001, 1 page.

Patent Abstracts of Japan, Publication No. 2000-241454 dated Sep. 8, 2000, 1 page.

International Search Report dated Mar. 9, 2004 issued in PCT/JP03/14796 (2 pages).

Microfilm of the specification and drawings annexed to the request of Japanaeses Utility Model Application No. 15633/1984 (Laid-open No. 127572/1985), with English translation (3 pages).

Microfilm of the specificaiton and drawing annexed to the request of Japanese Utility Model Application No. 150788/1984 (Laid-open No. 68533/1986). with English translation (3 pages).

* cited by examiner

TESTING DEVICE AND TESTING METHOD FOR TESTING AN ELECTRONIC DEVICE

The present application is a continuation application of PCT/JP03/14796 filed on Nov. 20, 2003, which claims priority from a Japanese Patent application No. 2002-338336 filed on Nov. 21, 2002, the entire contents of which are incorporated herein by reference for all purposes.

BACKGROUND OF THE INVENTION

1. Field of the Invention

The present invention relates to a testing device and a testing method.

2. Description of Related Art

Conventionally, testing devices that measure a power source current in a device under test using an integrator are known as disclosed, for example, in Japanese Patent Laid-Open No. 2001-324552 and Japanese Patent Laid-Open No. 2000-241454. In these testing devices, a current detecting unit that detects the power source current and a current-voltage converting unit that outputs a voltage according to the current value detected by the current detecting unit have been provided in a device power source unit that supplies the power source current to the device under test.

However, when testing an electronic device such as large-scale integrated circuits, there was not space sufficient to mount a number of electronic circuits in the vicinity of the electronic device in some cases. In this case, it is difficult that the device power source unit is provided in the vicinity of the device under test. Therefore, it was difficult to measure the power source current that varies at high speed in the device under test with high precision, in some cases.

Therefore, it is an object of the present invention to provide a testing device, a testing method, and a current measuring device that can solve the foregoing problems. The above and other objects can be achieved by combinations described in the independent claims. The dependent claims define further advantageous and exemplary combinations of the present invention.

SUMMARY OF THE INVENTION

According to the first aspect of the present invention, there is provided a testing device that tests an electronic device. The testing device includes: a detection-voltage outputting unit operable to output a current detection voltage based on a power source current that the electronic device receives from a power source; a transmission line operable to transmit the current detection voltage; a detection amplifier operable to output an amplifier output voltage based on the current detection voltage received through the transmission line; a switching unit operable to select whether the current detection voltage is supplied to the detection amplifier; an integrator operable to output an integral value that is obtained by integrating values based on the amplifier output voltage; and a decision unit operable to decide whether the electronic device is good or bad based on the integral value.

Moreover, the switching unit may be serially connected to the detection amplifier via the transmission line, and select whether either of the current detection voltage or a predetermined potential is supplied to the detection amplifier. The decision unit may compute a peak current of the power source current based on the integral value to decide whether the testing device is good or bad. In addition, the distance between the detection-voltage outputting unit and the detection amplifier may be larger than that between the detection-voltage outputting unit and the electronic device.

Moreover, the testing device may further include a performance board that puts an IC socket holding the electronic device thereon, the detection-voltage outputting unit and the switching unit may be provided on the performance board, the detection amplifier may be provided outside the performance board, the transmission line may be a coaxial cable, and the switching unit may supply the current detection voltage to the detection amplifier via the coaxial cable.

Moreover, the testing device may further include a performance board that puts an IC socket holding the electronic device thereon and is formed with a printed-circuit board having power source wiring for transmitting the power source current, and the detection-voltage outputting unit may be provided on the performance board, and output the current detection voltage based on wiring resistance included in at least a part of the power source wiring.

Moreover, the integrator may have an accumulation capacitor that accumulates electric charges according to the current based on the amplifier output voltage to output the integral value based on the charges, and the testing device may further include an offset addition unit operable to discharge the current having a predetermined size from the accumulation capacitor to offer an offset to the integral value. In addition, the testing device may further include a test-pattern outputting unit operable to output a test pattern for testing the electronic device, the switching unit may select whether the current detection voltage is supplied to the detection amplifier according to at least a part of the test pattern, the integrator may have an initialization unit that initializes the integral value with a predetermined value before the test-pattern outputting unit starts to output the test pattern, the testing device may further include an analog-to-digital converter operable to convert the output of the integrator into digital form after the test-pattern outputting unit finishes outputting the test pattern, and the decision unit may decide whether the electronic device is good or bad based on the output of the analog-to-digital converter.

Moreover, the switching unit may be serially connected to the detection amplifier via the transmission line and supply either of the current detection voltage or a predetermined potential to the detection amplifier, the test-pattern outputting unit may repeatedly output the test pattern more than once, the initialization unit may initialize the integral value before the test-pattern outputting unit repeatedly outputs the test pattern more than once and hold the integral value during the repeated period without initializing the integral value, the switching unit may supply the current detection voltage to the detection amplifier whenever the test-pattern outputting unit outputs the test pattern according to at least a part of the test pattern and supply the predetermined potential to the detection amplifier while the test-pattern outputting unit does not output the test pattern, and the integrator may output the integral value that is integrated during the repeated period.

Moreover, the testing device may further include: a plurality of the detection amplifiers that is connected in parallel; a plurality of the switching units that is provided corresponding to each of the plurality of detection amplifiers and supplies the current detection voltage to the corresponding detection amplifiers at the timing different from one another; and a plurality of the integrators that is provided corresponding to each of the plurality of detection amplifiers and respectively outputs the integral values that are obtained by respectively integrating values based on the amplifier output voltage output from the corresponding detection amplifiers, in which the decision unit may decide whether the electronic device is good or bad based on the integral values respectively output from the plurality of integrators.

Moreover, the electronic device may receive the power source current from a plurality of power sources, the testing device may further include: a plurality of the detection-voltage outputting units that is provided corresponding to each of the plurality of power sources and respectively outputs the current detection voltage based on the power source current that the electronic device receives from the corresponding power sources; and a plurality of the detection amplifiers that respectively outputs the amplifier output voltage based on the current detection voltage respectively output from the plurality of detection-voltage outputting units, and the integrator may integrate addition values of values based on the amplifier output voltage respectively output the plurality of detection amplifiers.

Moreover, the electronic device may include a plurality of power source terminals that receives the power source current, the testing device may further include: a plurality of the detection-voltage outputting units that is provided corresponding to each of the plurality of power sources and respectively outputs the current detection voltage based on the power source current that the electronic device receives through the corresponding power source terminals; a plurality of the detection amplifiers that is provided corresponding to each of the plurality of detection-voltage outputting units and receives the current detection voltage from the corresponding detection-voltage outputting units; and a plurality of the integrators that is provided corresponding to each of the plurality of detection amplifiers and respectively outputs the integral values that are obtained by respectively integrating values based on the amplifier output voltage output from the corresponding detection amplifiers, and the decision unit may decide whether the electronic device is good or bad based on the integral values respectively output from the plurality of integrators.

Moreover, the testing device may further include: a test-pattern outputting unit operable to repeatedly output a test pattern for testing the electronic device more than once; and a switching control unit operable to hold the switching unit so that the current detection voltage is supplied to the detection amplifier during a predetermined measurement period for the test pattern and change start time of the measurement period into a predetermined change time shorter than the measurement period whenever the test-pattern outputting unit outputs the test pattern, in which the integrator may output the integral value corresponding to the test pattern whenever the test-pattern outputting unit outputs the test pattern, and the decision unit may compute a mean value of the currents that are measured for the plurality of measurement periods corresponding to the plurality of test patterns based on the plurality of integral values respectively output from the integrator corresponding to the plurality of test patterns and decide whether the electronic device is good or bad based on the computed mean current.

According to the second aspect of the present invention, there is provided a testing device that tests an electronic device. The testing device includes: a detection-voltage outputting unit operable to output a current detection voltage based on a power source current that the electronic device receives from a power source; an integrator operable to integrate values based on the current detection voltage; and a switching unit operable to select whether either of the current detection voltage or a predetermined potential is supplied to the integrator.

According to the third aspect of the present invention, there is provided a testing device that tests an electronic device. The testing device includes: a test-pattern outputting unit operable to repeatedly output a test pattern for testing the electronic device more than once; a detection-voltage outputting unit operable to output a current detection voltage based on a power source current that the electronic device receives from a power source; an integrator operable to integrate values based on the current detection voltage during the repeated period when the test-pattern outputting unit repeatedly outputs the test pattern more than once; a switching unit operable to supply a value based on the current detection voltage to the integrator whenever the test-pattern outputting unit outputs the test pattern according to at least a part of the test pattern and stop supplying the value based on the current detection voltage to the integrator while the test-pattern outputting unit does not output the test pattern; an analog-to-digital converter operable to convert the output of the integrator into digital form after the repeated period; and a decision unit operable to decide whether the electronic device is good or bad based on the output of the analog-to-digital converter.

According to the fourth aspect of the present invention, there is provided a testing method testing an electronic device. The testing method includes: a detection-voltage outputting step outputting a current detection voltage based on a power source current that the electronic device receives from a power source; a transmission step transmitting the current detection voltage; a amplifier outputting step outputting an amplifier output voltage based on the current detection voltage transmitted in the transmission step to a detection amplifier; a switching step selecting whether the current detection voltage is supplied to the detection amplifier; an integrating step outputting an integral value that is obtained by integrating values based on the amplifier output voltage to an integrator; and a decision step deciding whether the electronic device is good or bad based on the integral value.

According to the fifth aspect of the present invention, there is provided a current measuring device that measures a current to be measured. The current measuring device includes: a detection-voltage outputting unit operable to output a current detection voltage based on the current to be measured; a transmission line operable to transmit the current detection voltage; a detection amplifier operable to output an amplifier output voltage based on the current detection voltage received through the transmission line; a switching unit operable to select whether the current detection voltage is supplied to the detection amplifier; and an integrator operable to output an integral value that is obtained by integrating values based on the amplifier output voltage.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
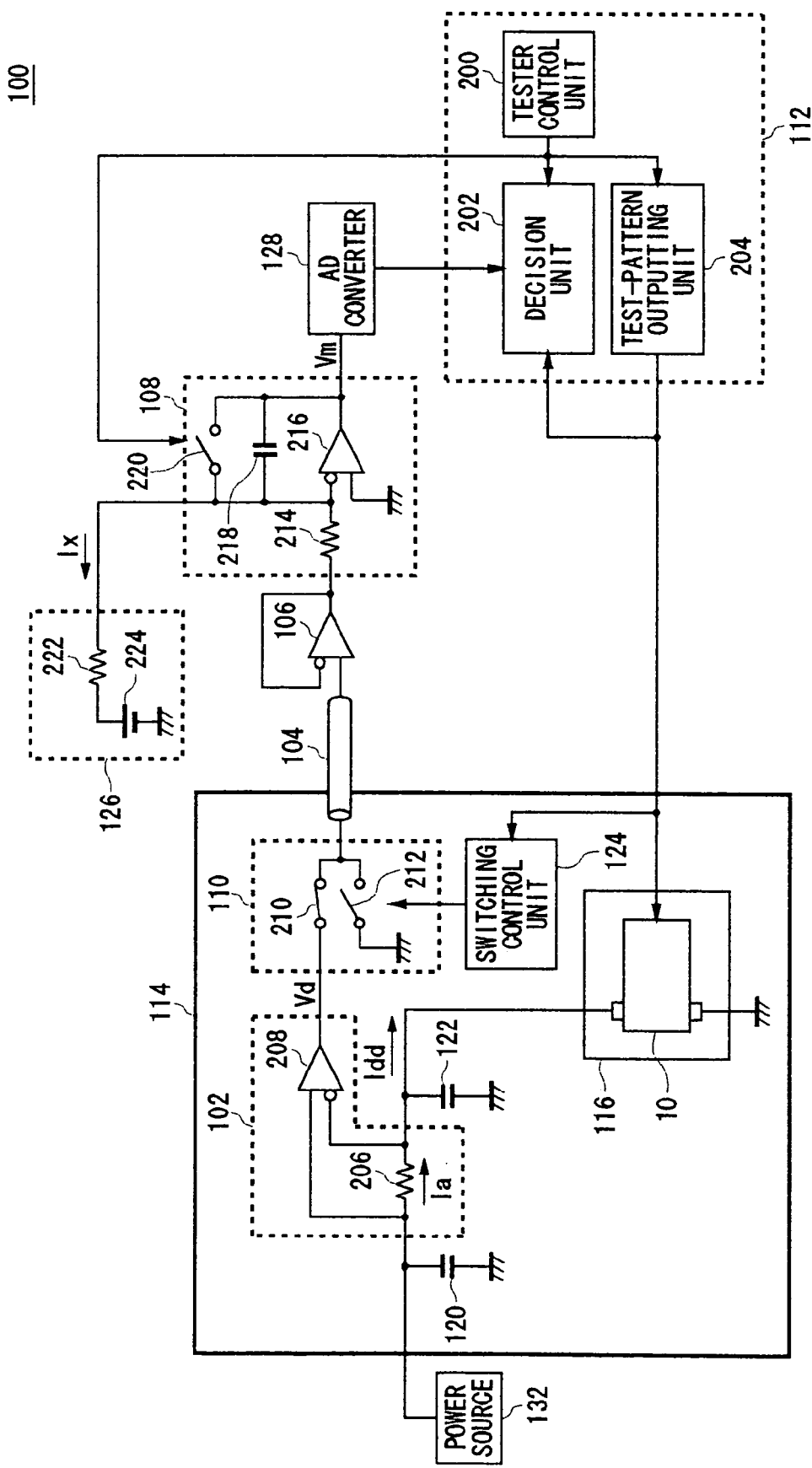
FIG. 1 is a view exemplary showing a configuration of a testing device.

FIG. 1 is a view exemplary showing a configuration of a testing device 100 according to an embodiment of the present invention. The testing device 100 of the present embodiment can measure a peak current of a power source current, which is received by an electronic device 10 and varies at high speeds, with high precision. In this way, the testing device 100 tests the electronic device 10 with high precision. The testing device 100 includes an IC socket 116, a performance board 114, a power source 132, a capacitor 120, a capacitor 122, a detection-voltage outputting unit 102, a switching unit 110, a switching control unit 124, a transmission line 104, an operational amplifier 106, an integrator 108, an analog-to-digital converter 128, an offset addition unit 126, and a test-signal processing unit 112.

The IC socket 116 is put on the performance board 114 to hold the electronic device 10. The performance board 114 is a connection unit that connects the IC socket 116 to the test-signal processing unit 112. In this example, the performance board 114 is formed with a printed-circuit board. The printed-circuit board has power source wiring to transmit a power source current (Idd) to be supplied to the electronic device 10.

The power source 132 supplies the power source current to the electronic device 10 via the detection-voltage outputting unit 102. In this example, the power source 132 applies a positive voltage to a power source terminal of the electronic device 10 to supply the power source current to the electronic device 10. Moreover, each of the capacitor 120 and the capacitor 122 is respectively provided in a former stage and a latter stage of the detection-voltage outputting unit 102 on the power source wiring to smooth the power source current. The capacitor 120 and the capacitor 122 supplies a smoothed current (Ia) based on the power source current to the detection-voltage outputting unit 102 by smoothing the power source current.

The detection-voltage outputting unit 102 is provided in the vicinity of the electronic device 10 on the performance board 114 and outputs a current detection voltage based on the power source current. The detection-voltage outputting unit 102 may be provided on, e.g., a test head that inputs and outputs a signal to the electronic device 10.

The detection-voltage outputting unit 102 has a resistor 206 and an operational amplifier 208. The resistor 206 is interposed between the power source 132 and the electronic device 10, and generates a voltage substantially proportional to the smoothed current on its both ends by flowing the smoothed current based on the power source current. In this way, the resistor 206 produces a voltage based on the power source current on its both ends. Moreover, the operational amplifier 208 outputs a current detection voltage (Vd) based on the voltage on both ends of the resistor 206. In this example, the operational amplifier 208 receives electric potential of the edge close to the power source 132 in the resistor 206 through its positive input, and receives electric potential of the edge close to the electronic device 10 through a negative input. Thereby, the operational amplifier 208 outputs a voltage substantially proportional to the smoothed current as the current detection voltage.

In addition, in this example, the resistor 206 is formed with a part of the power source wiring on the performance board 114. In this case, the detection-voltage outputting unit 102 outputs the current detection voltage based on the wiring resistor included in a part of the power source wiring. According to this example, it is possible to reduce the magnitude of voltage drop between the power source 132 and the electronic device 10 by reducing the voltage occurring on both ends of the resistor 206.

The switching unit 110 has a switch 210 and a switch 212. The switch 210 and the switch 212 are turned on or off according to an instruction received from the switching control unit 124. Here, when one is turned on, the other is turned off. The switch 210 selects whether the current detection voltage received from the detection-voltage outputting unit 102 is output to the transmission line 104. Moreover, the switch 212 selects whether ground potential is output to the transmission line 104. In this way, the switching unit 110 selects whether either of the current detection voltage or the ground potential is supplied to the operational amplifier 106.

In addition, in this example, the switching unit 110 is provided on the performance board 114. The switching unit 110 is serially connected to the operational amplifier 106 via the transmission line 104, and supplies the current detection voltage to the operational amplifier 106 via the transmission line 104. In another example, the switching unit 110 may be provided between the transmission line 104 and the operational amplifier 106. In this case, the switching unit 110 selects whether the current detection current received via the transmission line 104 is supplied to the operational amplifier 106.

The switching control unit 124 receives a part of test pattern from the test-signal processing unit 112, and switches the switching unit 110 according to this. Therefore, the switching unit 110 selects whether the current detection voltage is supplied to the operational amplifier 106 according to a part of the test pattern.

The transmission line 104 transmits the current detection voltage by electrically connecting the switching unit 110 and the operational amplifier 106. In this example, the transmission line 104 is a coaxial cable. In this case, it is possible to adequately transmit the current detection voltage by reducing noises occurring on the transmission line 104.

The operational amplifier 106 is provided outside the performance board 114, and outputs an amplifier output voltage based on the current detection voltage received via the transmission line 104. In this example, the operational amplifier 106 is a voltage follower. In this case, the operational amplifier 106 outputs the amplifier output voltage generally equal to the current detection voltage. In another example, the operational amplifier 106 may output the amplifier output voltage that is made by amplifying or reducing the current detection voltage.

In addition, the operational amplifier 106 has high input impedance. Therefore, according to this example, it is possible to reduce voltage drop occurring on the transmission line 104 by reducing the current flowing into the transmission line 104. In this way, the transmission line 104 transmits the current detection voltage with high precision.

The integrator 108 has an operational amplifier 216, a resistor 214, a capacitor 218, and a switch 220. In the operational amplifier 216, its positive input is grounded and its negative input receives the amplifier output voltage via the resistor 214. In this way, the resistor 214 flows an accumulated current generally proportional to the amplifier output voltage.

Since the capacitor 218 is interposed between the output and negative input of the operational amplifier 216, the capacitor 218 accumulates electric charges according to the accumulated current flowed by the resistor 214. The capacitor 218 outputs an integral value (Vm), which is obtained by integrating values based on the amplifier output voltage, based on the accumulated charges. In this way, the integrator 108 integrates values based on the amplifier output voltage. Moreover, the switch 220 is an example of an initialization unit that initializes the integral value output from the integrator 108 by causing both ends of the capacitor 218 to short-circuit electrically when the switch 220 is turned on.

In addition, in another example, the operational amplifier 216 may receive a predetermined reference potential different from the ground potential through the positive input. In this case, the integrator 108 integrates values based on the difference between the amplifier output voltage and the reference potential. Moreover, it is preferable to output the reference potential when the switch 212 of the switching unit 110 is turned on.

The analog-to-digital converter 128 converts the integral value output from the integrator 108 into digital formto supply the digital value to the test-signal processing unit 112. Moreover, the offset addition unit 126 has a resistor 222 and a constant voltage source 224. The resistor 222 electrically connects the constant voltage source 224 and the negative input of the operational amplifier 216 to discharge an emission current (Ix) with a predetermined dimension from the capacitor 218. In this way, the offset addition unit 126 offers an offset to the integral value output from the integrator 108.

Thereby, the offset addition unit 126 adequately changes the integral value output from the integrator 108 in accordance with input range of the analog-to-digital converter 128. Therefore, according to this example, the testing device 100 can adequately measure a wide range of power source current. Furthermore, according to this example, it is possible to easily change the size of offset that the offset addition unit 126 offers to the integrator 108 by changing the magnitude of the output voltage of constant voltage source 224 or the resistor 222. In addition, in this example, the resistor 222 discharges a negative emission current from the capacitor 218. In another example, the resistor 222 may discharge a positive emission current.

The test-signal processing unit 112 has a test-pattern outputting unit 204, a decision unit 202, and a tester control unit 200. The test-pattern outputting unit 204 outputs a test pattern to test the electronic device 10 to supply the pattern to the electronic device 10. Moreover, the test-pattern outputting unit 204 supplies a part of the test pattern to the switching control unit 124 to control the switching control unit 124.

The decision unit 202 decides whether the electronic device 10 is good or bad based on the test pattern output from the test-pattern outputting unit 204 and the integral value converted by the analog-to-digital converter 128 into the digital value. For example, the decision unit 202 computes a peak current of the power source current based on the integral value to decide whether the electronic device 10 is good or bad. Moreover, the tester control unit 200 controls the decision unit 202, the test-pattern outputting unit 204, and the switch 220.

Here, in this example, the integrator 108 receives and integrates the value based on the current detection voltage by way of the amplifier output voltage. In this case, the distance between the detection-voltage outputting unit 102 and the operational amplifier 106 may be larger than that between the detection-voltage outputting unit 102 and the electronic device 10. Therefore, according to this example, the detection-voltage outputting unit 102 can be provided in the vicinity of the electronic device 10, e.g., on the performance board 114, and the operational amplifier 106 and the integrator 108 can be provided in a position apart from the electronic device 10, e.g., outside the performance board 114. In this case, although a space on which circuits can be mounted is small in the vicinity of the electronic device 10, it is possible to detect the power source current with high precision.

Moreover, in this example, the switching unit 110 supplies either of the current detection voltage or the ground potential to the operational amplifier 106 via the transmission line 104. Therefore, according to this example, it is possible to adequately hold the output of the operational amplifier 106 while the switch 210 is turned off. Moreover, in this way, it is possible to cause the integrator 108 to adequately integrate the values.

Moreover, in another example, the electronic device 10 may be a semiconductor wafer. In this case, it is preferable that the detection-voltage outputting unit 102 and the switching unit 110 are provided on a probe card that is electrically connected to the semiconductor wafer. In this case, it is possible to test the semiconductor wafer with high precision.

Figure 2:
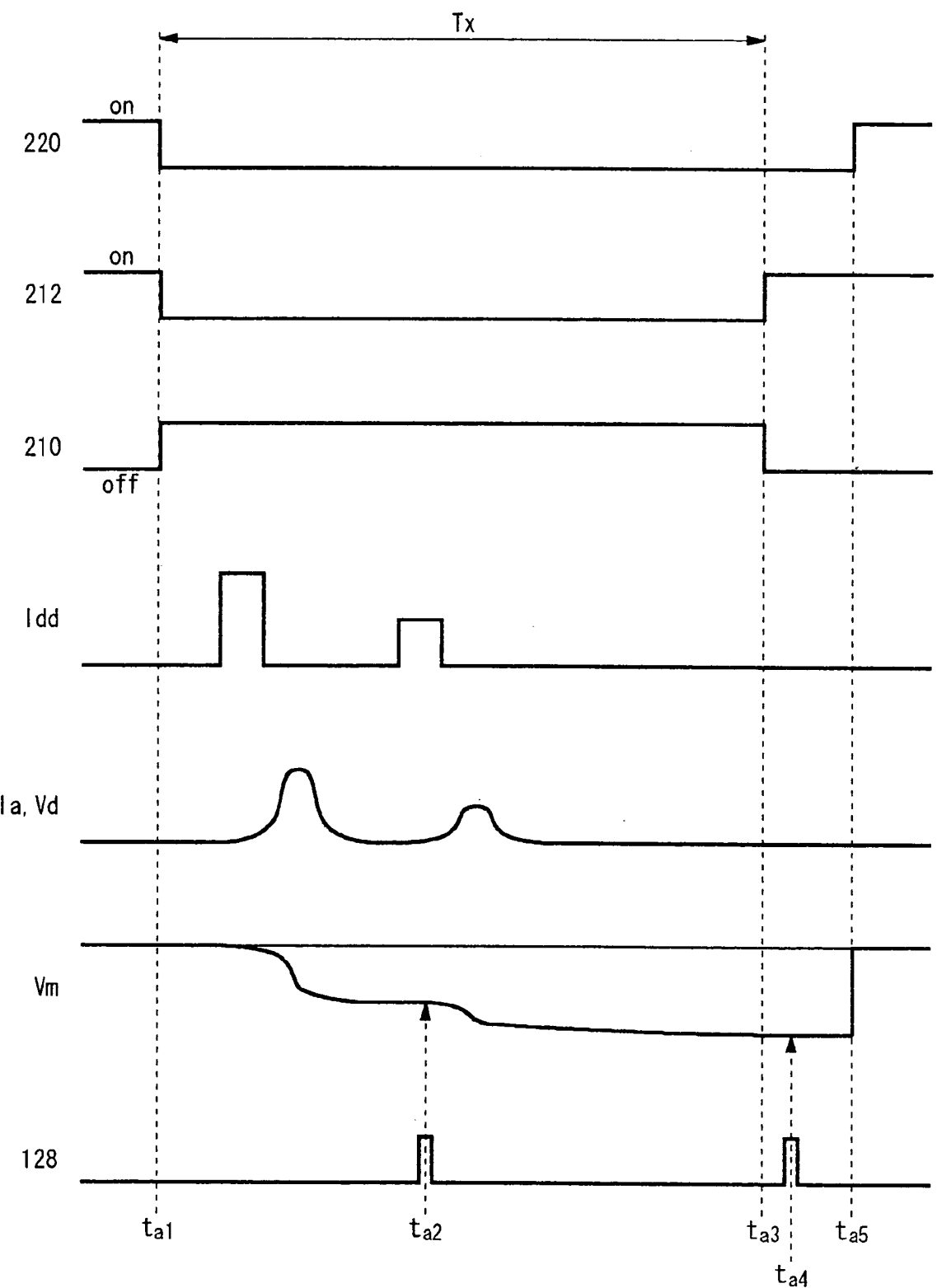
FIG. 2 is a timing-chart exemplary showing an operation of the testing device.

FIG. 2 is a timing-chart exemplary showing an operation of the testing device 100. The testing device 100 measures a mean value of the power source current for a section corresponding to time interval Tx in reference to the test pattern output from the test-pattern outputting unit 204.

Since the switch 212 is on and the switch 210 is off before time ta1, the switching unit 110 is supplying a ground potential to the operational amplifier 106. Moreover, since the switch 220 is on, both ends of the capacitor 218 is short-circuited electrically and the integral value in the integrator 108 is initialized.

At the time ta1, the tester control unit 200 turns off the switch 220 to cause the integrator 108 to start integration, and the switching control unit 124 turns off the switch 212 and on the switch 210 to cause the switching unit 110 to output the current detection voltage.

In this case, a smoothed current (Ia) and a current detection voltage (Vd) are changed according to a power source current (Idd) received by the electronic device 10, and also an integral value (Vm) output from the integrator 108 is changed according to the change of the current detection voltage. In addition, the switch 220 may be turned off before the time ta1. It is preferable that the switch 220 initializes the integral value with a predetermined value before the test-pattern outputting unit 204 starts outputting the test pattern.

Then, at time ta3, the switching control unit 124 turns on the switch 212 and off the switch 210 to stop outputting the current detection voltage and starts outputting the ground potential to the switching unit 110. In this way, to stop outputting the amplifier output voltage from the operational amplifier 106, the integrator 108 stops integrating values based on the power source current at the time ta3.

Then, at time ta4, the analog-to-digital converter 128 converts the integral value output from the integrator 108 into digital form to supply the digital value to the decision unit 202. After the test-pattern outputting unit 204 stops outputting the test pattern, the analog-to-digital converter 128 may convert the output of the integrator 108 into digital form. Then, at time ta5, the tester control unit 200 turns on the switch 220 to initialize the integral value.

Here, the decision unit 202 computes a mean value of the power source current for time interval Tx between the time ta1 and the time ta3 based on the converted digital integral value. In this way, the testing device 100 performs an Idd test, e.g., for the electronic device 10. According to this example, it is possible to perform the Idd test for the electronic device 10 with high precision by measuring the power source current with high precision.

Moreover, in this example, the switching unit 110 outputs the ground potential while the switch 210 is turned off. Therefore, although it is assumed that the integrator 108 has continued integration while the switch 210 is turned off, the integrator 108 holds the integral value when the switch 210 is turned on. Therefore, the analog-to-digital converter 128 may convert the integral value into digital form by large time resolution of a time constant in comparison with the change of test pattern. According to this example, cheap and generalized components such as the operational amplifier 106, the integrator 108, and the analog-to-digital converter 128 can be used. Thereby, it is possible to reduce a cost of the testing device 100.

Moreover, the switching control unit 124 controls the switch 210 and the switch 212 according to the test pattern. In this case, it is possible to define the period for which the integrator 108 integrates values based on the amplifier output voltage with high precision. In addition, the tester control unit 200 may control the switch 220 by large time accuracy of a time constant in comparison with the change of test pattern.

In addition, in this example, the analog-to-digital converter 128 further converts the integral value output from the integrator 108 into digital form at the time ta2 after the time ta1 and before the time ta3. In this case, the electronic device 10 can be tested with higher precision by monitoring the change of the integral value.

Figure 3:
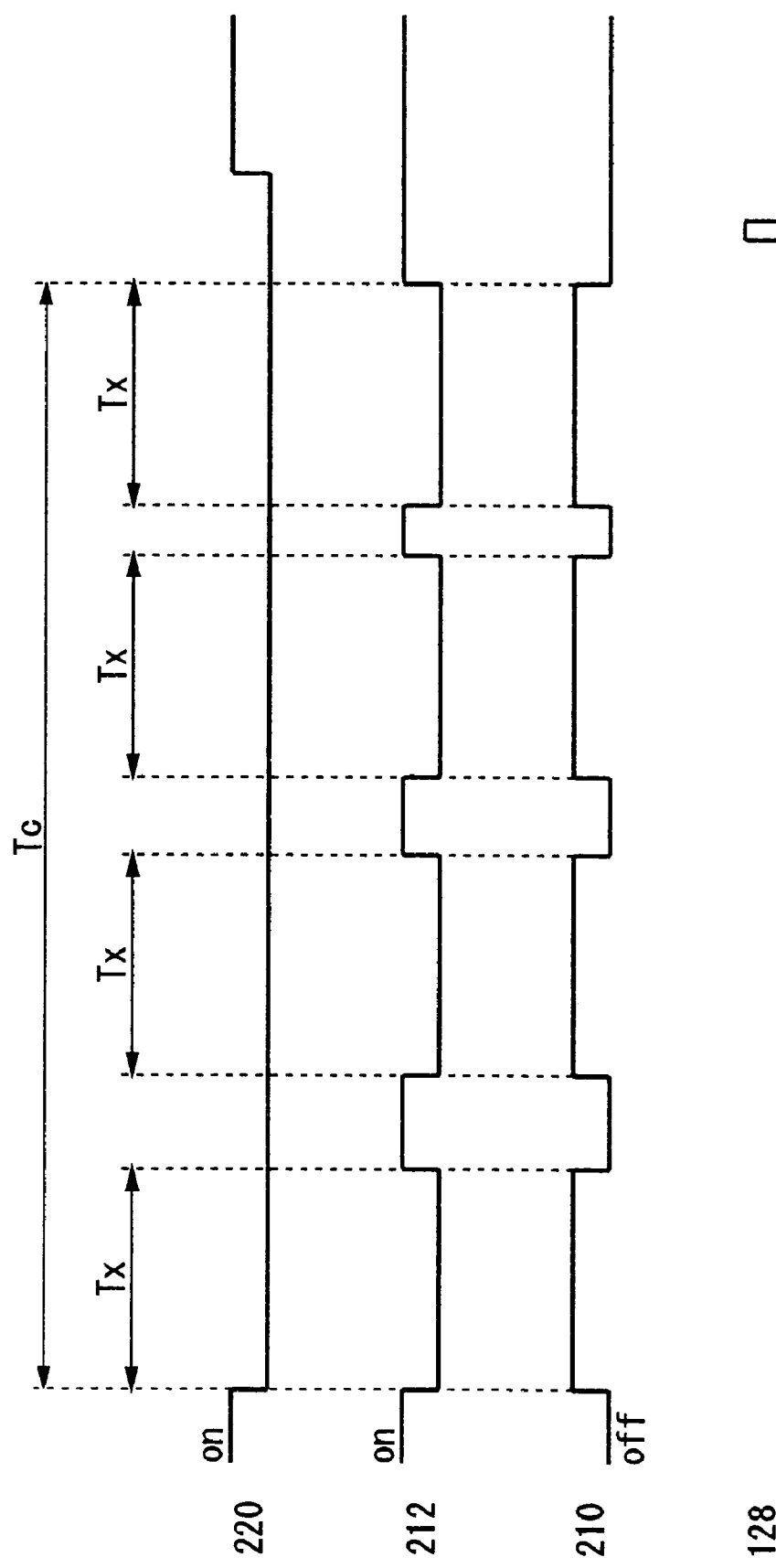
FIG. 3 is a timing-chart showing another example of an operation of the testing device.

FIG. 3 is a timing-chart showing another example of an operation of the testing device 100. In this example, the test-pattern outputting unit 204 repeatedly outputs the test pattern corresponding to time Tx more than once for a predetermined repetition period Tc.

Here, the switch 220 is turned on to initialize the integral value of the integrator 108 before the repeated period Tc, and holds an off state for the repeated period Tc to hold the integral value without initializing the integral value. Therefore, the integrator 108 outputs the integral value that is obtained by integrating values based on the power source current for the repeated period Tc.

Moreover, the switch 210 is turned on whenever the test-pattern outputting unit 204 outputs this test pattern. Therefore, whenever the test-pattern outputting unit 204 outputs this test pattern, the switching unit 110 supplies the current detection voltage to the operational amplifier 106 according to a part of the test pattern. Moreover, the switching unit 110 supplies the ground potential to the operational amplifier 106 while the test-pattern outputting unit 204 does not output this test pattern. The switching unit 110 may stop supplying values based on the current detection voltage to the integrator 108 while the test-pattern outputting unit 204 does not output this test pattern.

In this way, the integrator 108 adds the integral value corresponding to one test pattern by the number of repeated test patterns. Then, the integrator 108 outputs the addition value as the integral value after the repeated period Tc. The integrator 108 may integrate values based on the current detection voltage for the repeated period Tc.

The decision unit 202 computes the integral value converted by the analog-to-digital converter 128 into digital form and a mean value of the power source current for a period corresponding to one test pattern based on the repetition number of test pattern. According to this example, it is possible to compute the mean value of the power source current with high precision.

Figure 4:
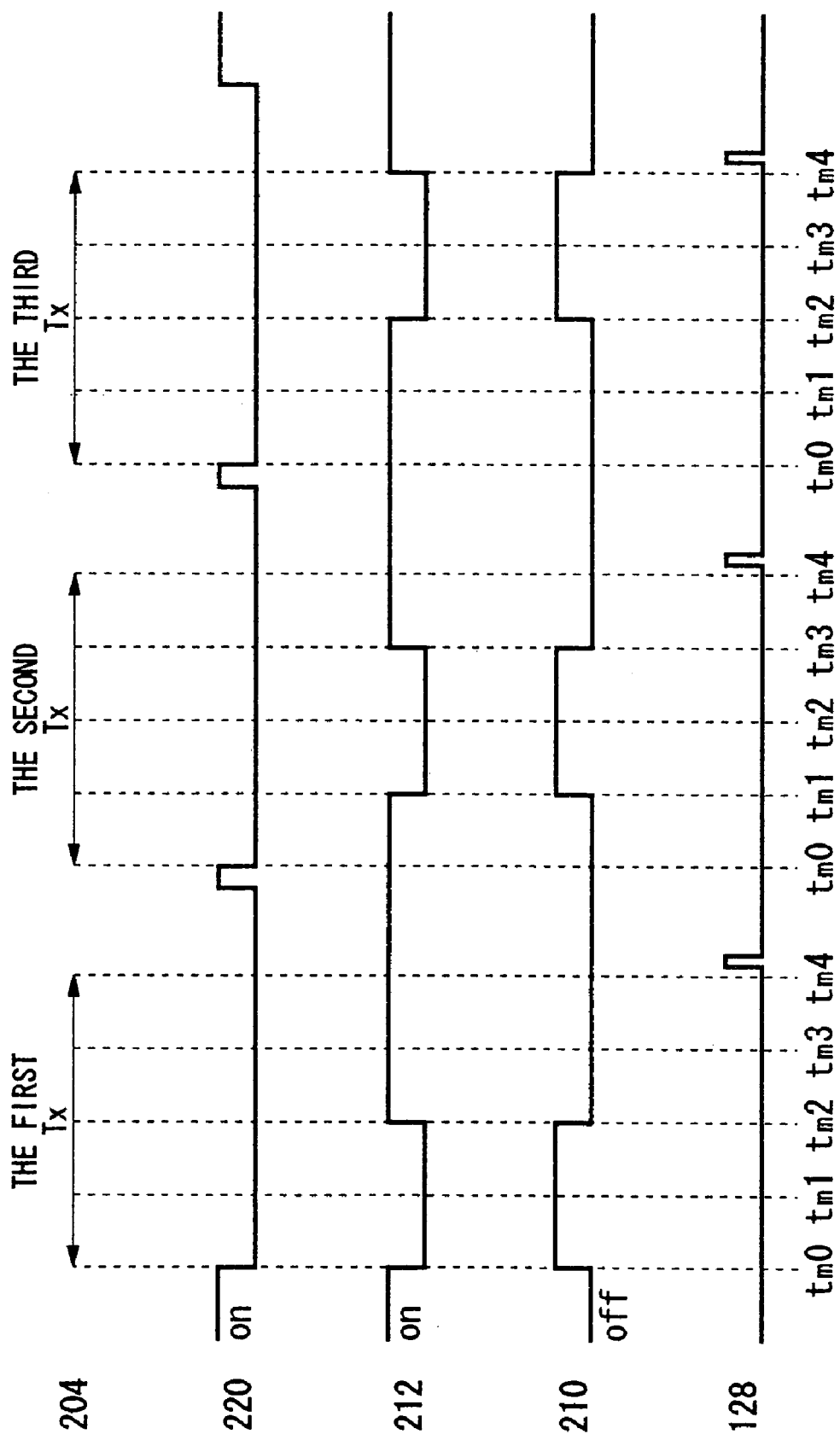
FIG. 4 is a timing-chart showing further another example of an operation of the testing device.

FIG. 4 is a timing-chart showing further another example of an operation of the testing device 100. In this example, the test-pattern outputting unit 204 repeatedly outputs the test patterns corresponding to the time Tx more than once.

Moreover, the switching control unit 124 outputs the current detection voltage to the switching unit 110 for a part of the time Tx for which the test pattern of every time is maintained. In this example, the switching control unit 124 outputs the current detection voltage to the switching unit 110 for a period corresponding to tm0 to tm2 in the time Tx in reference to the first test pattern. The switching control unit 124 respectively outputs the current detection voltage to the switching unit 110 for periods corresponding to tm1 to tm2 and tm2 to tm3 in reference to the second and third test patterns.

In other words, the switching control unit 124 holds the switch 210 and the switch 212 in the switching unit 110 for a predetermined measurement period in reference to the test pattern so that the current detection voltage flows into the operational amplifier 106. Moreover, the switching control unit 124 changes the start timing of measurement period into a predetermined change time shorter than the measurement period whenever the decision unit 202 outputs the test pattern.

Moreover, the integrator 108 outputs the integral value corresponding to the test pattern whenever the test-pattern outputting unit 204 outputs the test pattern. Then, the analog-to-digital converter 128 converts the integral value output from the integrator 108 into digital form to supply the digital value to the decision unit 202 in correspondence with each of the test patterns. The switch 220 initializes the integral value of the integrator 108 whenever the analog-to-digital converter 128 performs the analog/digital conversion.

Moreover, the decision unit 202 receives the plurality of integral values respectively output from the integrator 108 in correspondence with the test patterns. Then, the decision unit 202 computes a mean current for time interval corresponding to tm1 to tm2 in reference to the test pattern based on the plurality of integral values corresponding to the first and second test patterns. Moreover, the decision unit 202 computes a mean current for time interval corresponding to tm2 to tm3 in reference to the test pattern based on the plurality of integral values corresponding to the second and third test patterns. In other words, the decision unit 202 computes a mean value of the currents that are measured for the plurality of measurement periods corresponding to the plurality of test patterns based on the plurality of integral values. Then, the decision unit 202 decides whether the electronic device 10 is good or bad based on the computed mean current. According to this example, it is possible to measure the mean current for a period shorter than the measurement period.

Figure 5:
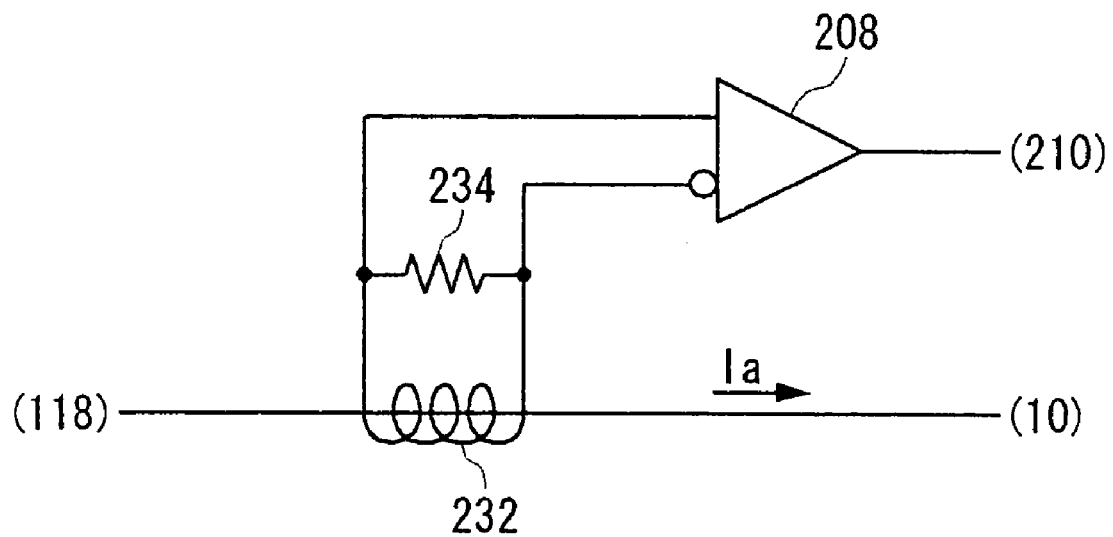
FIG. 5 is a view showing another example of a configuration of a detection-voltage outputting unit.

FIG. 5 is a view showing another example of a configuration of the detection-voltage outputting unit 102. In this example, the detection-voltage outputting unit 102 has a coil 232 and a resistor 234 in place of the resistor 206 (see FIG. 1)

The coil 232 causes power source wiring to pass through its inside to generate a voltage according to the change of the smoothed current (Ia) based on the power source current on both ends thereof. Moreover, each of one end and the other end of the coil 232 is electrically connected to each of a positive input and a negative input of the operational amplifier 208. In this way, the operational amplifier 208 outputs the current detection voltage based on the power source current.

Moreover, the resistor 234 is connected to the coil 232 in parallel to electrically connect the positive input and the negative input of the operational amplifier 208. The resistor 234 flows the current according to the voltage occurring on both ends of the coil 232 to prevent the charges from being accumulated on an input terminal of the operational amplifier 208. In this way, the resistor 234 keeps the potential of the input of the operational amplifier 208 adequate. By this example, it is possible to measure the power source current adequately.

Figure 6:
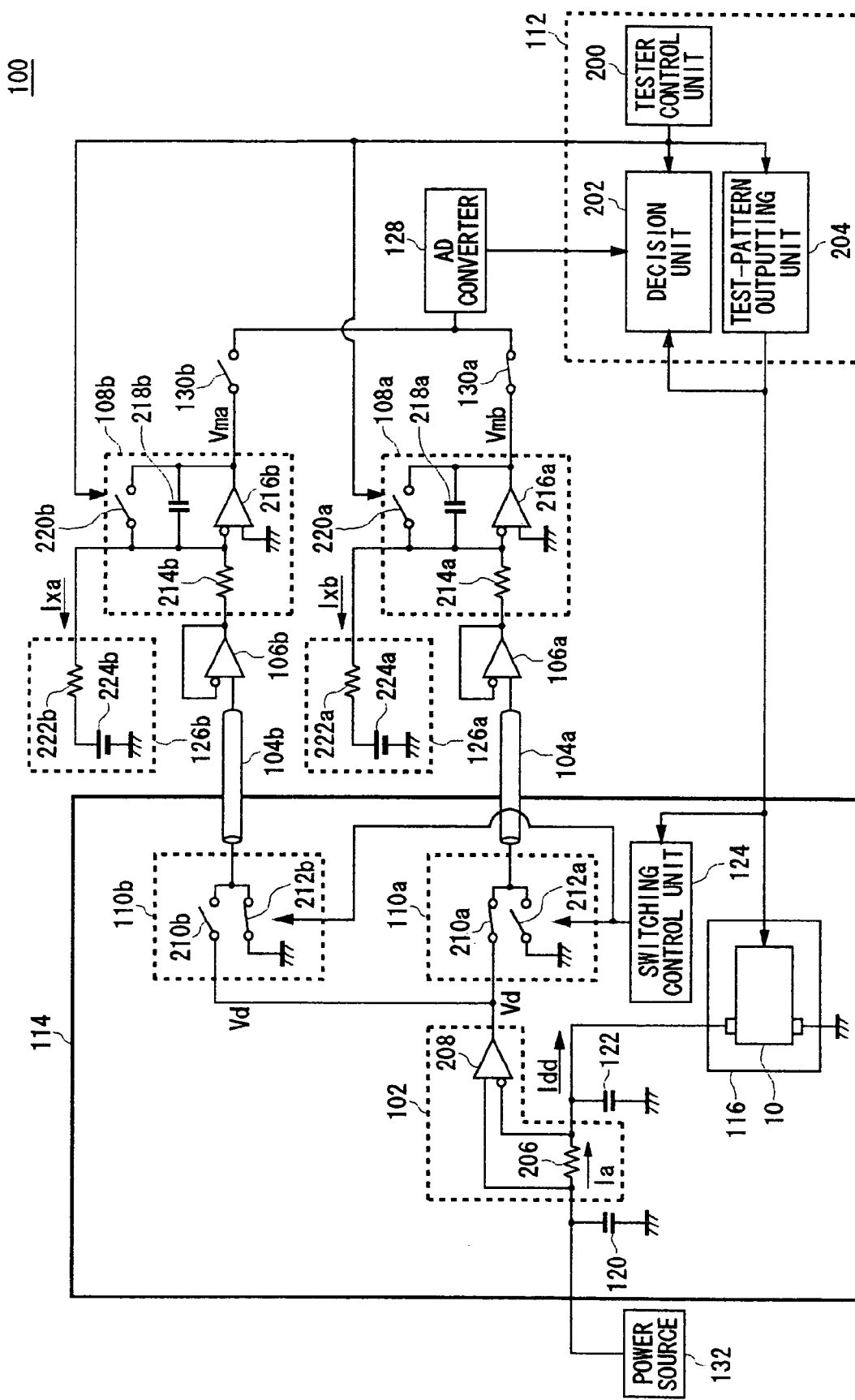
FIG. 6 is a view showing another example of a configuration of the testing device.

FIG. 6 is a view showing another example of a configuration of the testing device 100. In this example, the testing device 100 includes a plurality of switching units 110a and 110b provided corresponding to each other, a plurality of transmission lines 104a and 104b, a plurality of operational amplifiers 106a and 106b, a plurality of integrators 108a and 108b, a plurality of offset addition units 126a and 126b, and a plurality of switches 130a and 130b. Each of the plurality of switches 130a and 130b selects whether the integral values output from each of the plurality of integrators 108a and 108b are supplied to the analog-to-digital converter 128. When the switches 130a and 130b are turned on, the switches 130a and 130b supply the corresponding integral values to the analog-to-digital converter 128.

In this example, the plurality of operational amplifiers 106a and 106b is connected to each other in parallel. The switching control unit 124 switches the plurality of switching units 110a and 110b with timing different from each other. The plurality of switching units 110a and 110b supplies the current detection voltage to the corresponding operational amplifiers 106a and 106b with timing different from each other to output the amplifier output voltage with timing different from each other. Moreover, the integrators 108 respectively output the integral values (Vma and Vmb) that are obtained by respectively integrating values based on the amplifier output voltage output from the corresponding operational amplifiers 106. The analog-to-digital converter 128 receives and converts the integral values respectively integrated by the plurality of integrators 108a and 108b via each of the plurality of switches 130a and 130b into digital form. The decision unit 202 decides whether the electronic device 10 is good or bad based on the integral values respectively output from the plurality of integrators 108a and 108b.

In this example, the plurality of integrators 108a and 108b integrates values based on the amplifier output voltage during a period different from each other. Therefore, according to this example, it is possible to adequately measure the power source current for the plurality of consecutive periods. In addition, in further point, since the components of FIG. 6 having the same reference numbers as those of FIG. 1 have the same or similar functions as or to those of FIG. 1, their descriptions will be omitted.

Figure 7:
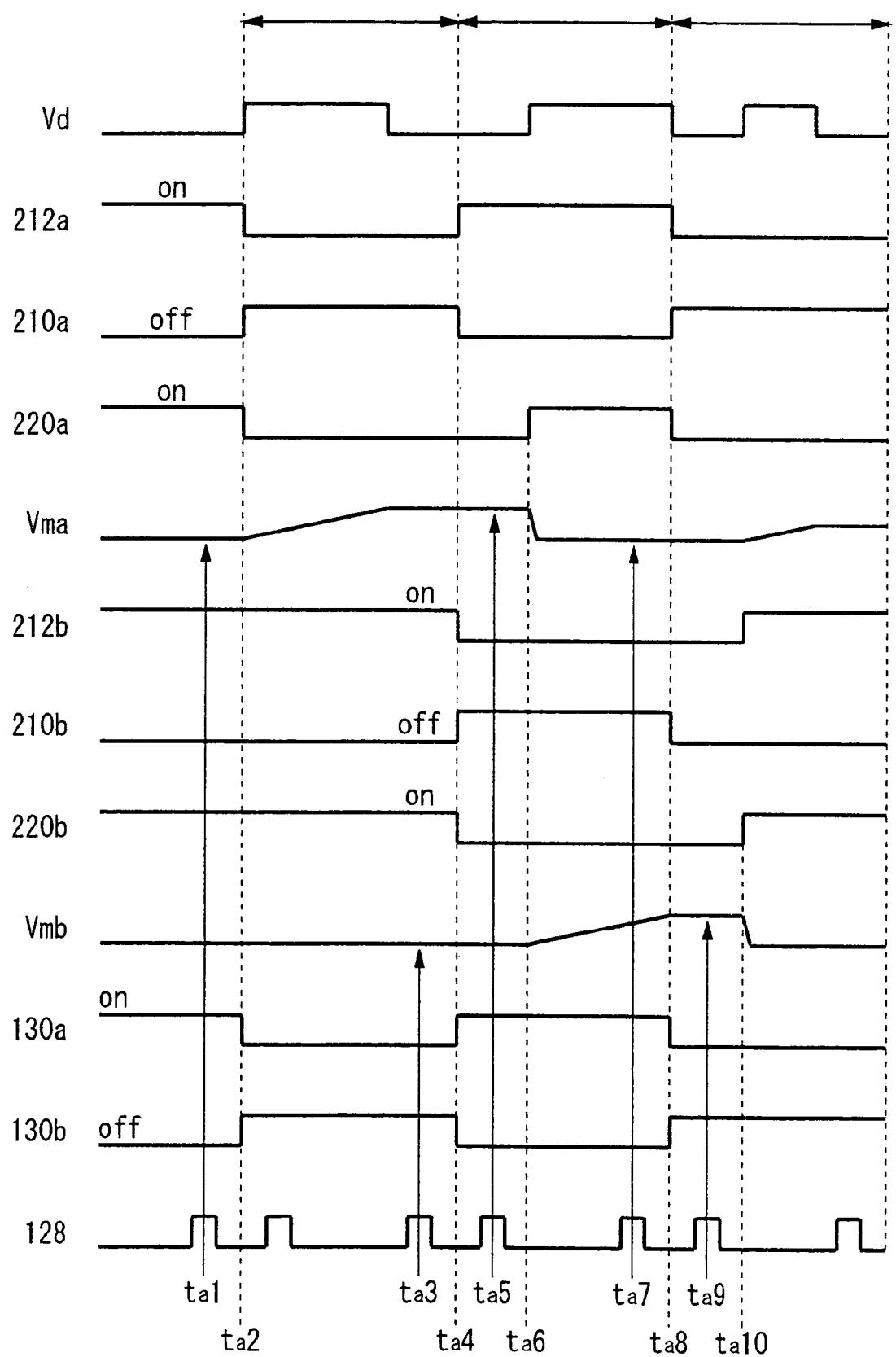
FIG. 7 is a timing-chart exemplary showing an operation of the testing device.

FIG. 7 is a timing-chart exemplary showing an operation of the testing device 100 explained by means of FIG. 6. At the first time ta1, the switch 210a is off, the switch 220a is on, the switch 210b is off, the switch 220b is on, the switch 130a is on, and the switch 130b is off. In addition, since each of the switch 212a and the switch 212b has a state opposite to each of the switch 210a and the switch 210b, their operational descriptions will be omitted.

Moreover, at the time ta1, the analog-to-digital converter 128 converts the integral value (Vma) output from the integrator 108a into digital form. In this way, the decision unit 202 measures the output of the integrator 108a in a state that the integral value is initialized.

Then, at the time ta2, the switch 210a, the switch 220a, and the switches 130a and 130b turn over their states, and at the time ta3, the analog-to-digital converter 128 converts the integral value (Vmb) output from the integrator 108b into digital form. In this way, the decision unit 202 measures the output of the integrator 108b in a state that the integral value is initialized.

Then, at the time ta4, the switches 210a and 210b, the switch 220b, the switches 130a and 130b turn over their states, and at the time ta5, the analog-to-digital converter 128 converts the integral value (Vma) of the integrator 108a into digital form. The decision unit 202 may modify an offset error of the integral value (Vma) measured at the time ta5 based on an initial value of the integral value (Vma) measured at the time ta1. In this case, it is possible to measure the power source current with higher precision.

Then, at the time ta6, the switch 220a turns over its state and initializes the integral value (Vma) of the integrator 108a, and at the time ta7, the analog-to-digital converter 128 converts the initialized integral value (Vma) into digital form again.

Then, at the time ta8, the switches 210a and 210b, the switch 220a, and the switches 130a and 130b turn over their states, and at the time ta9, the analog-to-digital converter 128 converts the integral value (Vmb) of the integrator 108b into digital form. The decision unit 202 may modify an offset error based on an initial value of the integral value (Vmb) measured at the time ta3. Then, at the time ta10, the switch 220b turns over its state and initializes the integral value of the integrator 108b. According to this example, it is possible to measure the power source current continuously.

Figure 8:
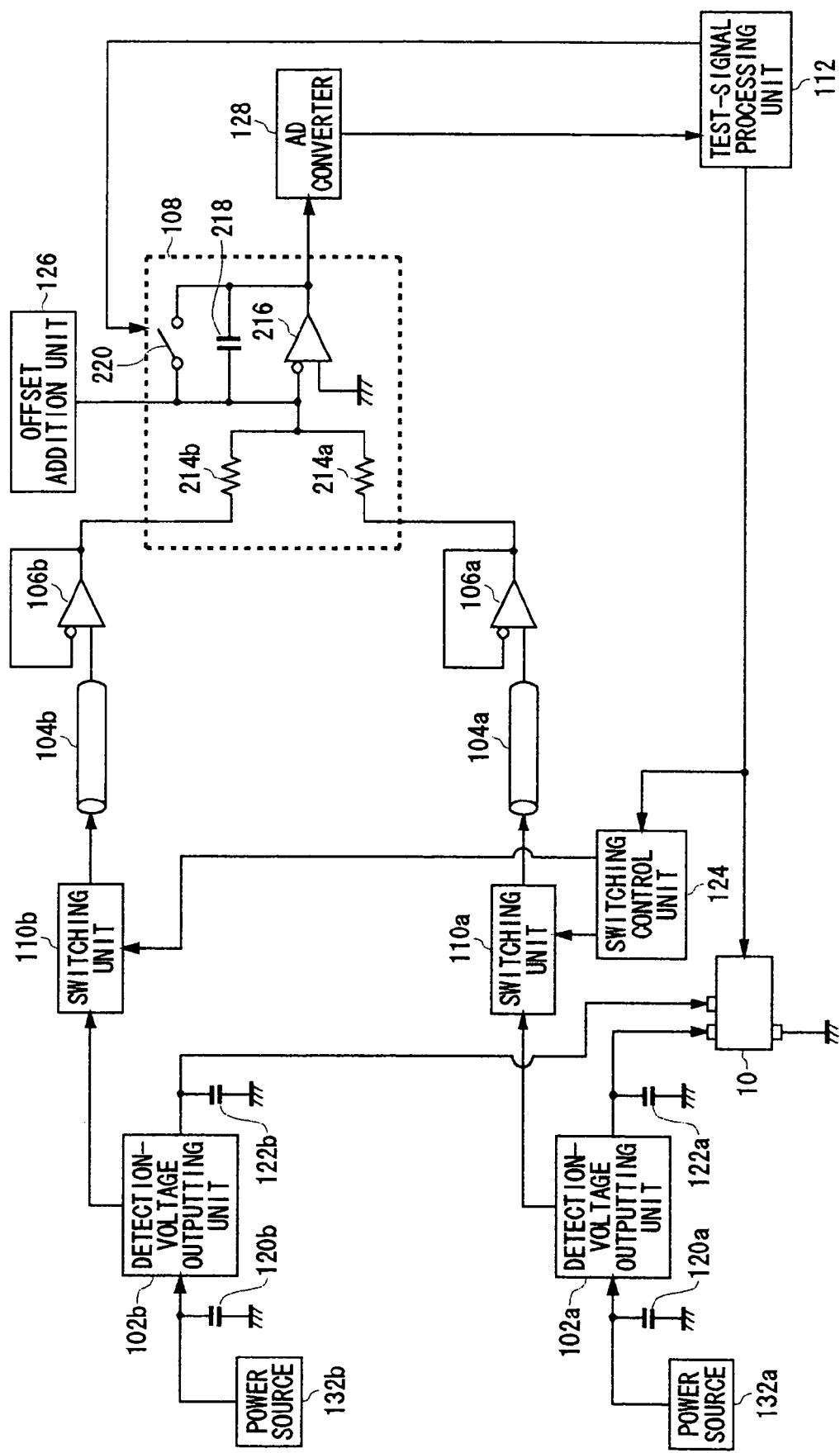
FIG. 8 is a view showing further another example of a configuration of the testing device.

FIG. 8 is a view showing further another example of a configuration of the testing device 100. In this example, the electronic device 10 receives the power source current from a plurality of power sources 132a and 132b. The testing device 100 includes a plurality of detection-voltage outputting units 102a and 120b provided respectively corresponding to the plurality of power sources 132a and 132b, a plurality of switching units 110a and 110b, a plurality of transmission lines 104a and 104b, and a plurality of operational amplifiers 106a and 106b.

Each of the plurality of detection-voltage outputting units 102a and 120b respectively outputs the current detection voltage based on the power source current that the electronic device 10 receives from the corresponding power sources 132. The plurality of operational amplifiers 106a and 106b receives the current detection voltage from each of the plurality of detection-voltage outputting units 102a and 102b and respectively outputs the amplifier output voltage based on this current detection voltage.

Moreover, in this example, the integrator 108 has a plurality of resistors 214a and 214b provided in parallel corresponding to each of the plurality of operational amplifiers 106a and 106b. The plurality of resistors 214a and 214b electrically connects a negative input of the operational amplifier 216 and an output of the corresponding operational amplifier 106. In this way, the integrator 108 integrates addition values of values based on the amplifier output voltage output from each of the plurality of operational amplifiers 106a and 106b. Therefore, according to this example, it is possible to adequately measure the power source current that the electronic device 10 receives from the plurality of power sources 132.

In addition, in this example, the electronic device 10 includes a plurality of power source terminals corresponding to the plurality of power sources 132a and 132b. Each of the power source terminals receives the power source current from the corresponding power sources 132. In another example, the electronic device 10 may receive the power source current from the plurality of power sources 132a and 132b through one power source terminal. Moreover, in further point, since the components of FIG. 8 having the same reference numbers as those of FIG. 1 have the same or similar functions as or to those of FIG. 1, their descriptions will be omitted.

Figure 9:
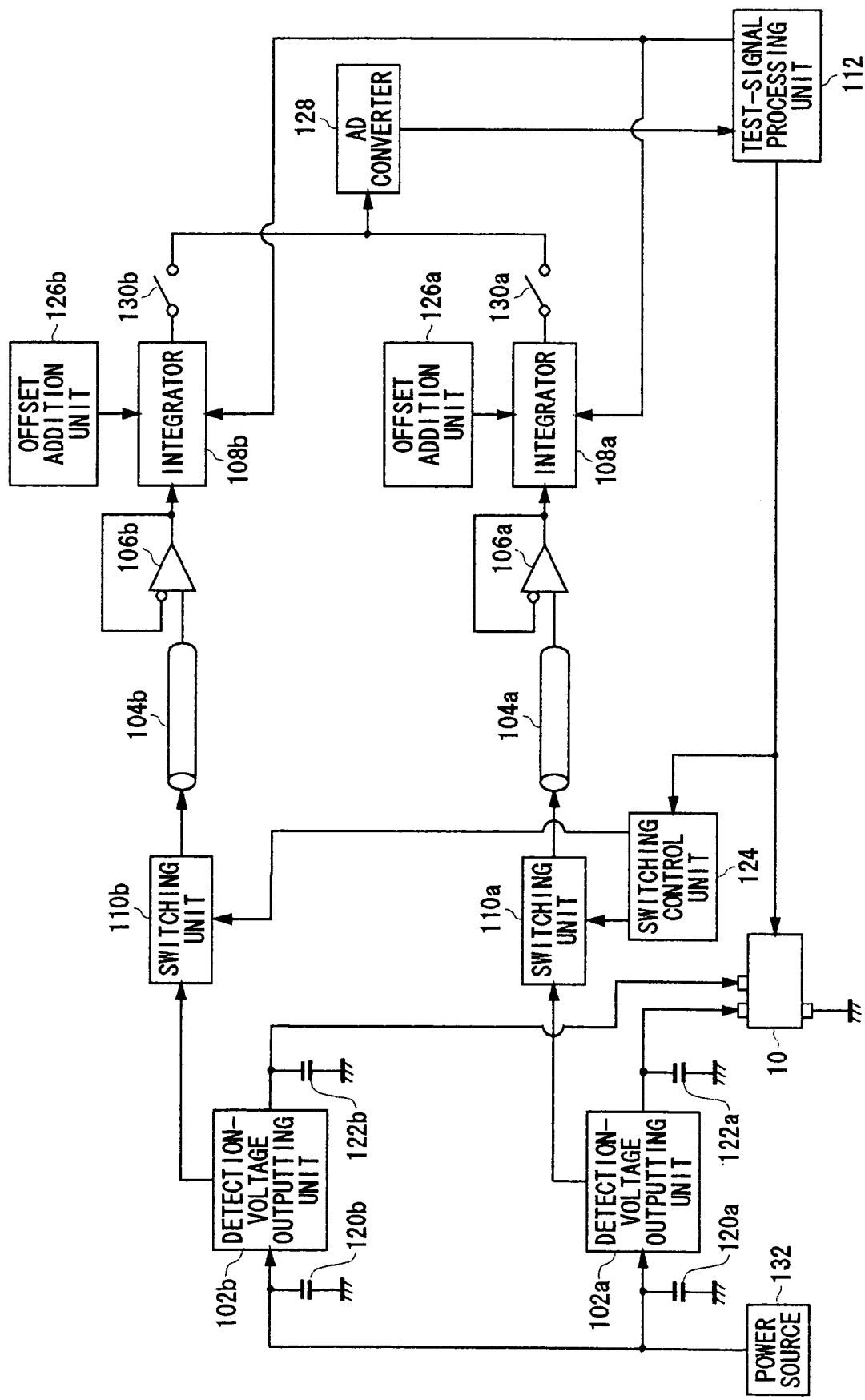
FIG. 9 is a view showing further another example of a configuration of the testing device.

FIG. 9 is a view showing further another example of a configuration of the testing device 100. In this example, the electronic device 10 includes a plurality of power source terminals that receives the power source current. Moreover, the testing device 100 includes a plurality of detection-voltage outputting units 102a and 102b provided respectively corresponding to the plurality of power source terminals, a plurality of switching units 110a and 110b, a plurality of transmission lines 104a and 104b, a plurality of operational amplifiers 106a and 106b, a plurality of integrators 108a and 108b, a plurality of offset addition units 126a and 126b, and a plurality of switches 130a and 130b.

Each of the plurality of detection-voltage outputting units 102a and 102b respectively outputs the current detection voltage based on the power source current that the electronic device 10 receives through the corresponding power source terminals. Moreover, each of the plurality of operational amplifiers 106a and 106b receives the current detection voltage from the corresponding detection-voltage outputting units 102. Each of the plurality of integrators 108a and 108b respectively outputs the integral value that is obtained by respectively integrating values based on the amplifier output voltage output from the corresponding operational amplifiers 106.

Moreover, each of the plurality of switches 130a and 130b selects whether the integral value output from each of the integrators 108a and 108b is supplied to the analog-to-digital converter 128. Then, the analog-to-digital converter 128 converts the integral value output from each of the plurality of integrators 108a and 108b into digital form to supply the digital value to the test-signal processing unit 112. In this example, the test-signal processing unit 112 has a decision unit 202 (not shown) having the same or similar functions as or to the decision unit 202 explained by means of FIG. 1.

The decision unit decides whether the electronic device 10 is good or bad based on the integral values output from the plurality of integrators 108a and 108b. The decision unit 202 may respectively measure the power source current received by each of the plurality of power source terminals of the electronic device 10. In this case, the decision unit 202 specifies a fault point in an electronic circuit that is formed within the electronic device 10, e.g., based on a measurement result of the power source current corresponding to each of the power source terminals. According to this example, it is possible to decide whether the electronic device 10 is good or bad with higher precision. In addition, in further point, since the components of FIG. 9 having the same reference numbers as those of FIG. 1 have the same or similar functions as or to those of FIG. 1, their descriptions will be omitted.

As is apparent from the above description, according to the present invention, it is possible to measure the power source current of the electronic device with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A testing device that tests an electronic device, comprising:
   a detection-voltage outputting unit operable to output a current detection voltage based on a power source current that the electronic device receives from a power source;
   a transmission line operable to transmit the current detection voltage;
   a detection amplifier operable to output an amplifier output voltage based on the current detection voltage received through said transmission line;
   a switching unit operable to select whether the current detection voltage is supplied to said detection amplifier;
   an integrator operable to output an integral value that is obtained by integrating values based on the amplifier output voltage; and
   a decision unit operable to decide whether the electronic device is good or bad based on the integral value.

2. The testing device as claimed in claim 1, wherein said switching unit is serially connected to said detection amplifier via said transmission line, and selects whether either of the current detection voltage or a predetermined potential is supplied to said detection amplifier.

3. The testing device as claimed in claim 1, wherein said decision unit computes a peak current of the power source current based on the integral value to decide whether the testing device is good or bad.

4. The testing device as claimed in claim 1, wherein the distance between said detection-voltage outputting unit and said detection amplifier is larger than that between said detection-voltage outputting unit and the electronic device.

5. The testing device as claimed in claim 1, wherein the testing device further comprises a performance board that puts an IC socket holding the electronic device thereon, said detection-voltage outputting unit and said switching unit are provided on said performance board, said detection amplifier is provided outside said performance board, said transmission line is a coaxial cable, and said switching unit supplies the current detection voltage to said detection amplifier via the coaxial cable.

6. The testing device as claimed in claim 1, wherein the testing device further comprises a performance board that puts an IC socket holding the electronic device thereon and is formed with a printed-circuit board having power source wiring for transmitting the power source current, and said detection-voltage outputting unit is provided on said performance board, and outputs the current detection voltage based on wiring resistance included in at least a part of the power source wiring.

7. The testing device as claimed in claim 1, wherein said integrator has an accumulation capacitor that accumulates electric charges according to the current based on the amplifier output voltage to output the integral value based on the charges, and the testing device further comprises an offset addition unit operable to discharge the current having a predetermined size from the accumulation capacitor to offer an offset to the integral value.

8. The testing device as claimed in claim 1, wherein the testing device further comprises a test-pattern outputting unit operable to output a test pattern for testing the electronic device, said switching unit selects whether the current detection voltage is supplied to said detection amplifier according to at least a part of the test pattern, said integrator has an initialization unit that initializes the integral value with a predetermined value before said test-pattern outputting unit starts to output the test pattern, the testing device further comprises an analog-to-digital converter operable to convert the output of said integrator into digital form after said test-pattern outputting unit finishes outputting the test pattern, and said decision unit decides whether the electronic device is good or bad based on the output of said analog-to-digital converter.

9. The testing device as claimed in claim 8, wherein said switching unit is serially connected to said detection amplifier via said transmission line and supplies either of the current detection voltage or a predetermined potential to said detection amplifier, said test-pattern outputting unit repeatedly outputs the test pattern more than once, the initialization unit initializes the integral value before said test-pattern outputting unit repeatedly outputs the test pattern more than once and holds the integral value during the repeated period without initializing the integral value, said switching unit supplies the current detection voltage to said detection amplifier whenever said test-pattern outputting unit outputs the test pattern according to at least a part of the test pattern and supplies the predetermined potential to said detection amplifier while said test-pattern outputting unit does not output the test pattern, and said integrator outputs the integral value that is integrated during the repeated period.

10. The testing device as claimed in claim 1, further comprising:
    a plurality of said detection amplifiers that is connected in parallel;
    a plurality of said switching units that is provided corresponding to each of said plurality of detection amplifiers and supplies the current detection voltage to said corresponding detection amplifiers at the timing different from one another; and
    a plurality of said integrators that is provided corresponding to each of said plurality of detection amplifiers and respectively outputs the integral values that are obtained by respectively integrating values based on the amplifier output voltage output from said corresponding detection amplifiers,
    wherein said decision unit decides whether the electronic device is good or bad based on the integral values respectively output from said plurality of integrators.

11. The testing device as claimed in claim 1, wherein the electronic device receives the power source current from a plurality of power sources, the testing device further comprises:
    a plurality of said detection-voltage outputting units that is provided corresponding to each of said plurality of power sources and respectively outputs the current detection voltage based on the power source current that the electronic device receives from said corresponding power sources; and
    a plurality of said detection amplifiers that respectively outputs the amplifier output voltage based on the current detection voltage respectively output from said plurality of detection-voltage outputting units, and said integrator integrates addition values of values based on the amplifier output voltage respectively output said plurality of detection amplifiers.

12. The testing device as claimed in claim 1, wherein the electronic device comprises a plurality of power source terminals that receives the power source current, the testing device further comprises:
    a plurality of said detection-voltage outputting units that is provided corresponding to each of said plurality of power sources and respectively outputs the current detection voltage based on the power source current that the electronic device receives through said corresponding power source terminals;
    a plurality of said detection amplifiers that is provided corresponding to each of said plurality of detection-voltage outputting units and receives the current detection voltage from said corresponding detection-voltage outputting units; and
    a plurality of said integrators that is provided corresponding to each of said plurality of detection amplifiers and respectively outputs the integral values that are obtained by respectively integrating values based on the amplifier output voltage output from said corresponding detection amplifiers, and said decision unit decides whether the electronic device is good or bad based on the integral values respectively output from said plurality of integrators.

13. The testing device as claimed in claim 1, further comprising:
    a test-pattern outputting unit operable to repeatedly output a test pattern for testing the electronic device more than once; and
    a switching control unit operable to hold said switching unit so that the current detection voltage is supplied to said detection amplifier during a predetermined measurement period for the test pattern and change start time of the measurement period into a predetermined change time shorter than the measurement period whenever said test-pattern outputting unit outputs the test pattern,
    wherein said integrator outputs the integral value corresponding to the test pattern whenever said test-pattern outputting unit outputs the test pattern, and said decision unit computes a mean value of the currents that are measured for the plurality of measurement periods corresponding to the plurality of test patterns based on the plurality of integral values respectively output from said integrator corresponding to the plurality of test patterns and decides whether the electronic device is good or bad based on the computed mean current.

14. A testing device that tests an electronic device, comprising:
    a detection-voltage outputting unit operable to output a current detection voltage based on a power source current that the electronic device receives from a power source;
    an integrator operable to integrate values based on the current detection voltage; and
    a switching unit operable to select whether either of the current detection voltage or a predetermined potential is supplied to said integrator.

15. A testing device that tests an electronic device, comprising:

a test-pattern outputting unit operable to repeatedly output a test pattern for testing the electronic device more than once;

a detection-voltage outputting unit operable to output a current detection voltage based on a power source current that the electronic device receives from a power source;

an integrator operable to integrate values based on the current detection voltage during the repeated period when said test-pattern outputting unit repeatedly outputs the test pattern more than once;

a switching unit operable to supply a value based on the current detection voltage to said integrator whenever said test-pattern outputting unit outputs the test pattern according to at least a part of the test pattern and stop supplying the value based on the current detection voltage to said integrator while said test-pattern outputting unit does not output the test pattern;

an analog-to-digital converter operable to convert the output of said integrator into digital form after the repeated period; and a decision unit operable to decide whether the electronic device is good or bad based on the output of said analog-to-digital converter.

16. A testing method testing an electronic device, comprising:

a detection-voltage outputting step outputting a current detection voltage based on a power source current that the electronic device receives from a power source;

a transmission step transmitting the current detection voltage;

an amplifier outputting step outputting an amplifier output voltage based on the current detection voltage transmitted in said transmission step to a detection amplifier;

a switching step selecting whether the current detection voltage is supplied to the detection amplifier;

an integrating step outputting an integral value obtained by integrating values based on the amplifier output voltage to an integrator; and a decision step deciding whether the electronic device is good or bad based on the integral value.

* * * * *